United States Patent [19]

Ellis

[11] Patent Number: 4,716,498
[45] Date of Patent: Dec. 29, 1987

[54] RACK MOUNTED CIRCUIT MODULE

[75] Inventor: Stafford M. Ellis, East Preston, England

[73] Assignee: GEC Avionics Limited, England

[21] Appl. No.: 797,245

[22] Filed: Nov. 12, 1985

[30] Foreign Application Priority Data

Nov. 23, 1984 [GB] United Kingdom ............. 8429685
Mar. 29, 1985 [GB] United Kingdom ............. 8508278

[51] Int. Cl.$^4$ .................................................. H05K 7/20
[52] U.S. Cl. .................................... 361/386; 361/395
[58] Field of Search ........................ 361/392–395, 361/399, 383, 386–388, 385, 398, 415; 339/75 MP, 75 R, 75 M, 112 R, 17 LM, 17 M, 17 W, 17 F; 165/80.1, 80.2, 80.3; 211/41

[56] References Cited

U.S. PATENT DOCUMENTS

| | | | |
|---|---|---|---|
| 3,506,877 | 4/1970 | Owen | 361/386 |
| 3,735,206 | 5/1973 | Pesek | 361/386 |
| 4,233,645 | 11/1980 | Balderes | 361/383 |
| 4,366,526 | 12/1982 | Lijoi | 361/385 |
| 4,369,485 | 1/1983 | Bell | 361/388 |
| 4,415,025 | 11/1983 | Horvath | 361/386 |
| 4,480,287 | 10/1984 | Jensen | 361/388 |
| 4,484,381 | 11/1984 | Ellis | 361/415 |
| 4,493,010 | 1/1985 | Morrison | 361/385 |
| 4,546,407 | 10/1985 | Benenati | 361/395 |
| 4,550,836 | 11/1985 | Ellis | 361/386 |
| 4,626,960 | 12/1986 | Hamano | 361/388 |

*Primary Examiner*—G. P. Tolin
*Attorney, Agent, or Firm*—Kirschstein, Kirschstein, Ottinger & Israel

[57] ABSTRACT

An electric circuit module suitable for mounting in a rack, e.g. by sliding action, in parallel spaced relationship with other similar modules, comprising a shallow box (111) having two heat conductive parts (113 and 115) each comprising one major wall of the box. The electrical components (139) of the module are mounted on the interior major surfaces of the two box parts (113 and 115) and the two parts provide heat paths between the components (139) and external surface portions (133) of the box.

12 Claims, 13 Drawing Figures

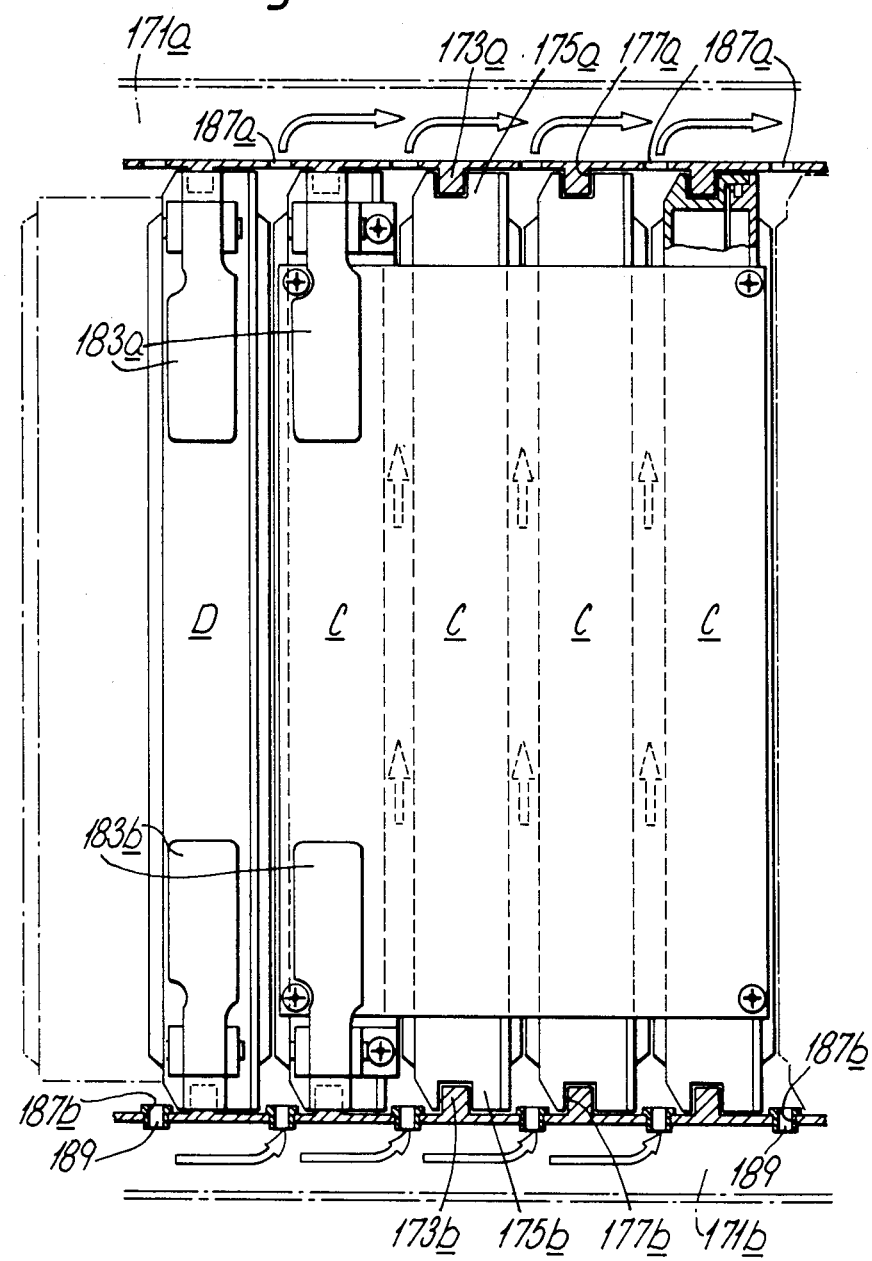

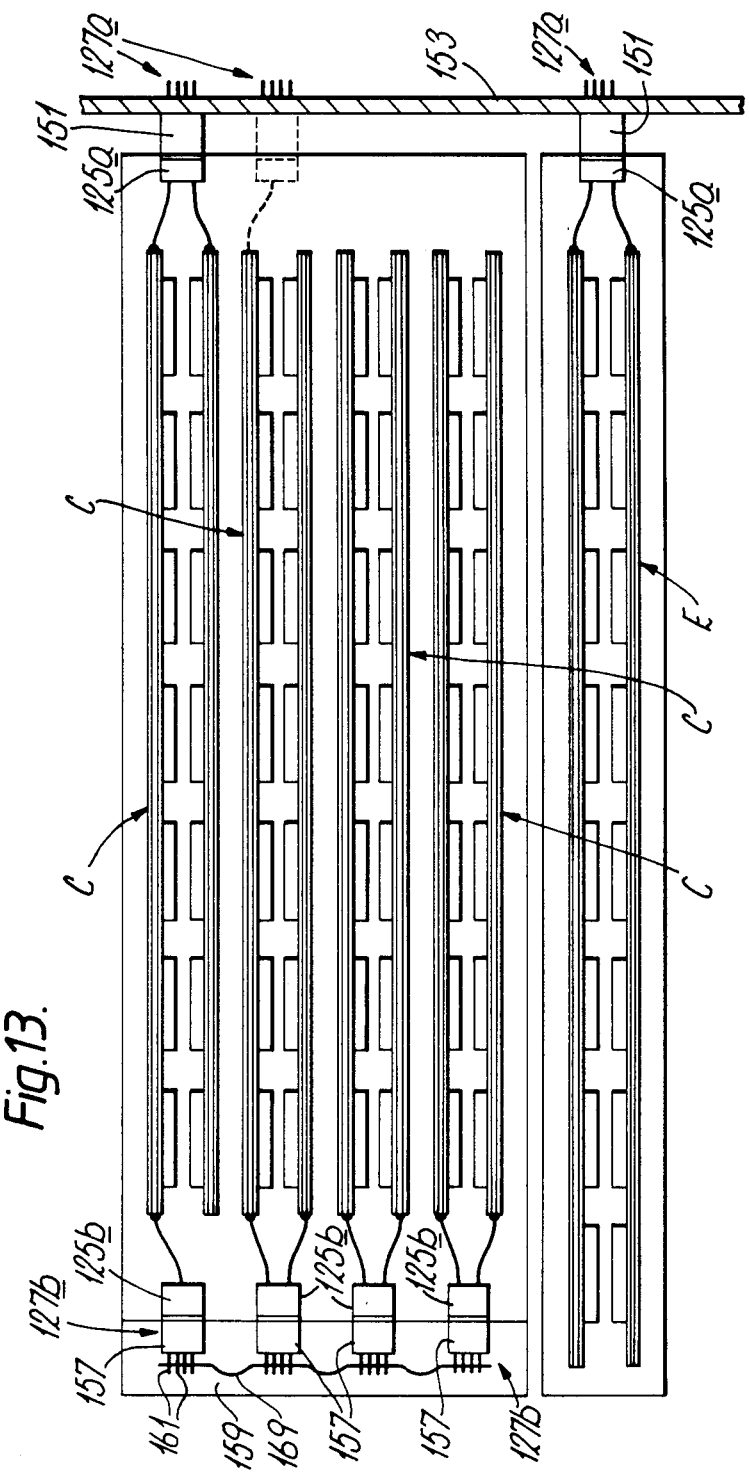

RACK MOUNTED CIRCUIT MODULE

BACKGROUND OF THE INVENTION

1. Field of the Invention

This invention relates to electric circuit modules.

More particularly the invention relates to electric circuit modules of the kind having a generally shallow box-like form and adapted to be mounted, e.g. by sliding action, in a rack, the module incorporating a path for the conduction of heat away from components of the module. A module of such a kind allows a number of modules to be accommodated compactly in a rack in parallel spaced relationship, without overheating problems, thus rendering the rack and its several modules suitable for locations where space is limited, for example, in vehicles.

2. Description of Related Art

A previously proposed, although hitherto undisclosed, module of the aforesaid kind comprises: a central heat conductive plate; two substrates adapted to carry electric circuit components and secured to the central plate one on each major surface thereof; two cover plates respectively serving as covers for the two substrates and electrical components carried thereby; and two elongate expansion devices extending lengthwise along lateral surface portions at opposite sides of one major surface of the central plate. In use of the module the said opposite lateral surface portions and their respective expansion devices are received within respective channels in opposed walls of a rack. Operation of the expansion devices by reaction with one of the side walls of the relevant channel and contact with the lateral surface portion drives correspondingly disposed lateral surface portions at opposite sides of the other major surface of the central plate into intimate contact with the opposite wall of the channel. Heat from electrical components carried by the substrates is then transferred to the central plate and, from thence, to the rack in which the module is held by heat conduction along well defined heat paths in the module. Normally there is attached to a side of the module extending between the lateral surface portions which contact the rack one part of a two-part electrical connector the other part of which is on the rack. The connection when made serves in the transmission of power and data signals to and from the electrical components of the module. One such previously proposed module is described in greater detail hereinafter.

SUMMARY OF THE INVENTION

It is an object of the present invention to provide an electrical circuit module of the aforesaid kind which exhibits higher thermal transfer efficiency than comparable known modules.

According to the present invention an electric circuit module comprises: a box comprising two heat conductive parts each of which comprises one major wall of the box; and electrical components mounted on the interior major surfaces of said two parts, said parts providing heat paths between the components mounted thereon and external surface portions of said box.

In one particular embodiment of the invention said external surface portions comprise surface portions of opposite end portions of the box, which surface portions with the module mounted on a rack, are adapted to make good thermal contact with the rack.

In one such embodiment said box has at each of said two opposite ends thereof a pair of opposed lateral surface portions one lateral surface portion in each pair being integral with one box part and the other lateral surface portion in each pair being integral with the other box part; and between each said pair of opposed lateral surface portions there is a respective elongate expansion device which is operable to produce relative movement between the two box parts in the direction normal to the lateral surface portions, thereby to bring said external surface portions into contact with said rack.

In such an embodiment of the invention each said lateral surface portion is suitably constituted by a first surface of a respective abutment projecting from a said box part, and each said external surface portion is constituted by a second surface of a respective said abutment, each expansion device and its two associated abutments being adapted to be received in a respective channel in the rack so that on operation of said expansion devices said second surface on each abutment contacts a respective side wall of the associated channel.

In another embodiment of the invention said external surface portions comprise external major surfaces of said box parts.

In such an embodiment said external major surfaces of said box parts preferably have a configuration of parallel rib portions.

In a module according to the invention the two box parts are preferably made separable.

In a module according to the invention at least some of said components are suitably mounted on two substrates respectively secured to the interior major surfaces of said two box parts.

Alternatively or additionally, at least some of said components may be mounted in surface contact with portions of said interior major surfaces. In such an arrangement said portions of said interior major surfaces may be constituted by inward facing surfaces of said interior major surfaces.

In such an arrangement each such electrical component may be pressed into surface contact with its pad portion by means of an individual U-shaped spring clip the two limb portions of which are fixed at their ends to the associated box part, and the bridge portion of which bears against the electrical component so as to hold the electrical component in contact with the said inward facing surface under spring pressure. The two limb portions suitably extend through spaced apart apertures in the associated box part, and are fixed at or near their ends thereto, e.g. by solder. If the external major surface of the associated box part has a configuration of parallel rib portions, the apertures are preferably positioned between pairs of adjacent rib portions.

A printed circuit board having a distribution of apertures corresponding to the distribution of pad portions may be located within a said box part with the pad portions received by the said apertures of the board and the electrical components in contact with the pad portions electrically connected to tracks of the board.

In a module according to the invention, part of a two-part electrical connector is normally attached to said box along a side thereof for making external connections to said component.

By comparison with the aforementioned previously proposed module a module in accordance with the present invention has the merits of weighing less, since the heat conducting means is constituted by the containing box itself rather than by a central heat conductive plate; may be more compact since, once again, no central plate is present; and, perhaps most important, has a thermal transfer efficiency substantially higher than than of previously proposed comparable modules.

BRIEF DESCRIPTION OF THE DRAWINGS

Two electric circuit modules in accordance with the invention will now be described by way of example with reference to the accompanying drawings, in which:

FIG. 12 shows in end elevation the arrangement of FIGS. 10 and 11; and

FIG. 13 is a simplified representation of the interconnection arrangement between the modules.

DETAILED DESCRIPTION OF THE PREFERRED EMBODIMENTS

Figure 1:
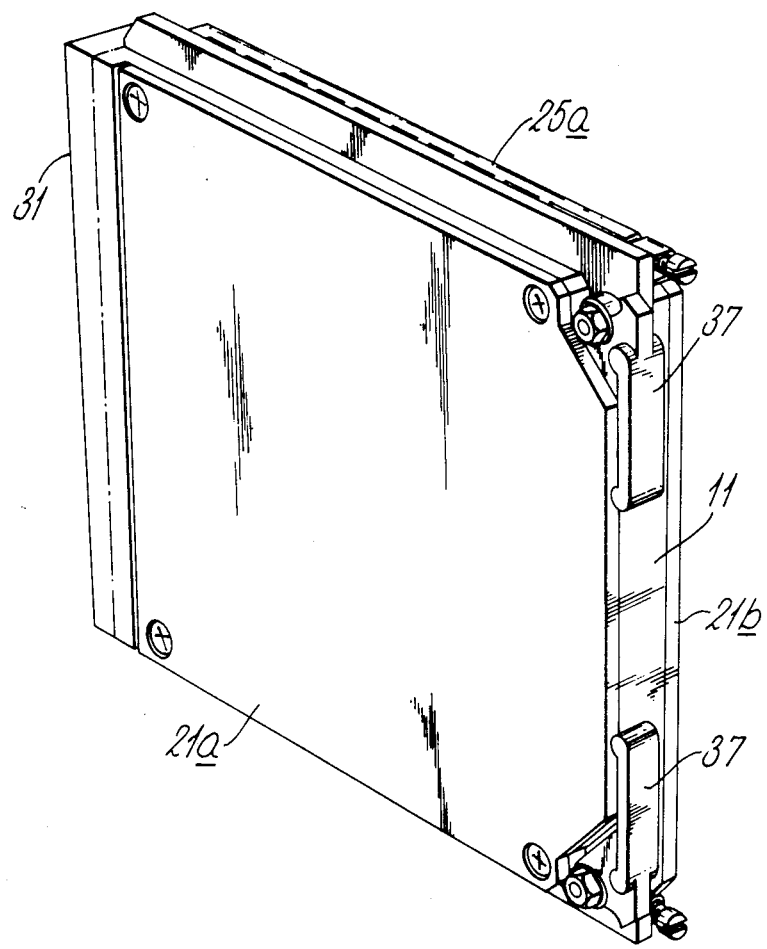
FIG. 1 is a perspective view of the aforementioned previously proposed electric circuit module according to the Prior Art.
Figure 2:
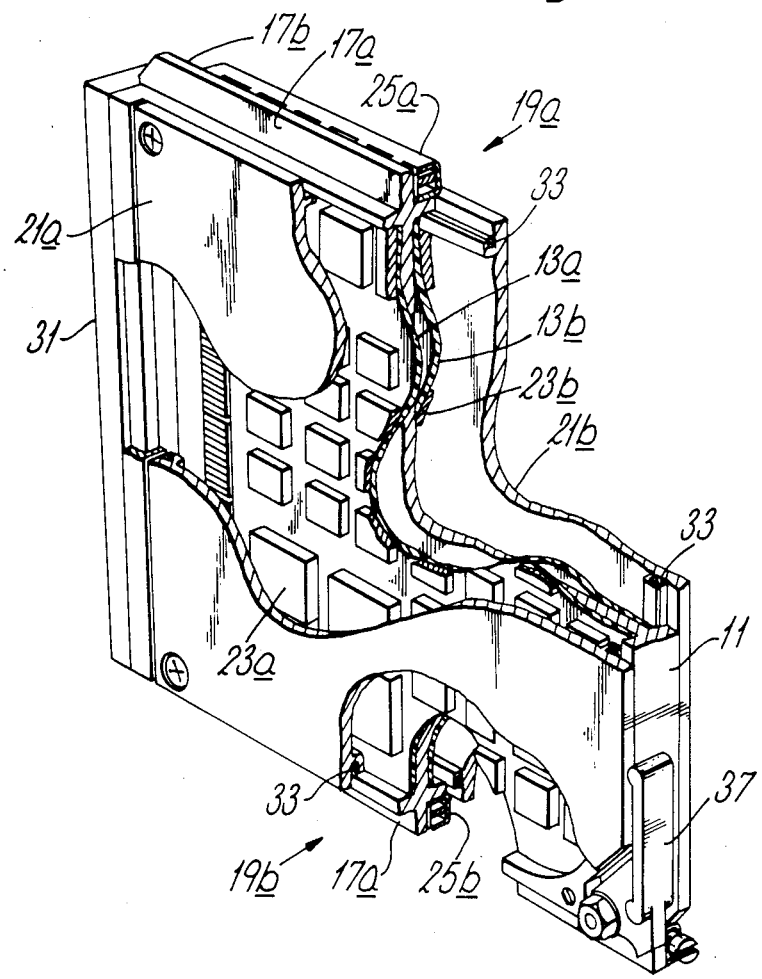
FIG. 2 shows, cut-away, a perspective view of the module of FIG. 1.
Figure 3:
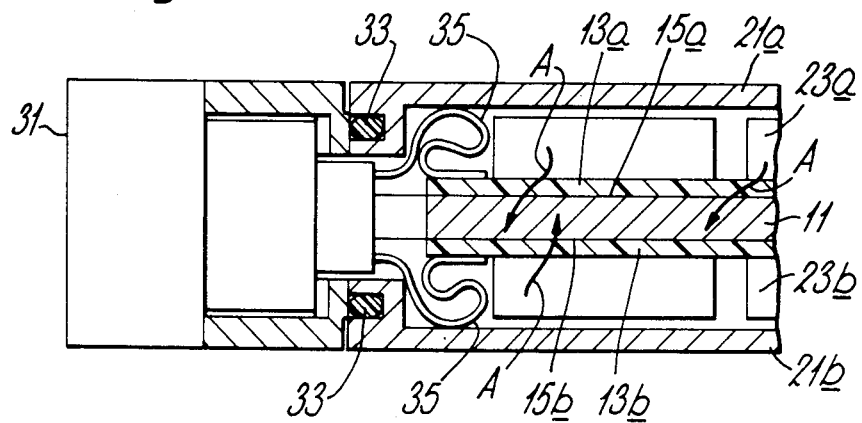
FIG. 3 shows a detail of the module of FIGS. 1 and 2.
Figure 4:
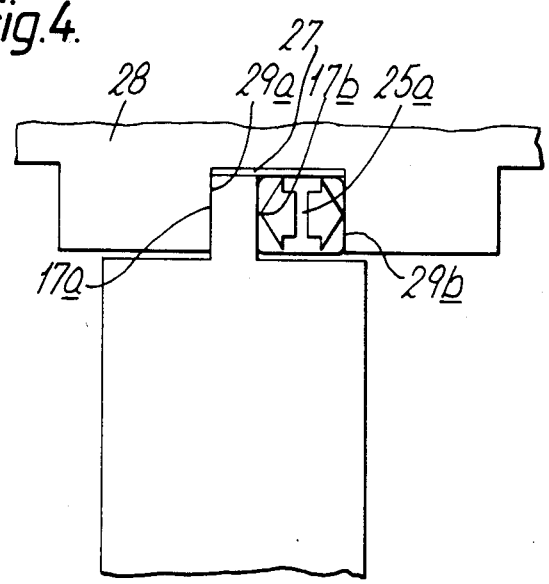
FIG. 4 is an outline diagram depicting the module of FIGS. 1 and 2 received in a rack channel.
Figure 5:
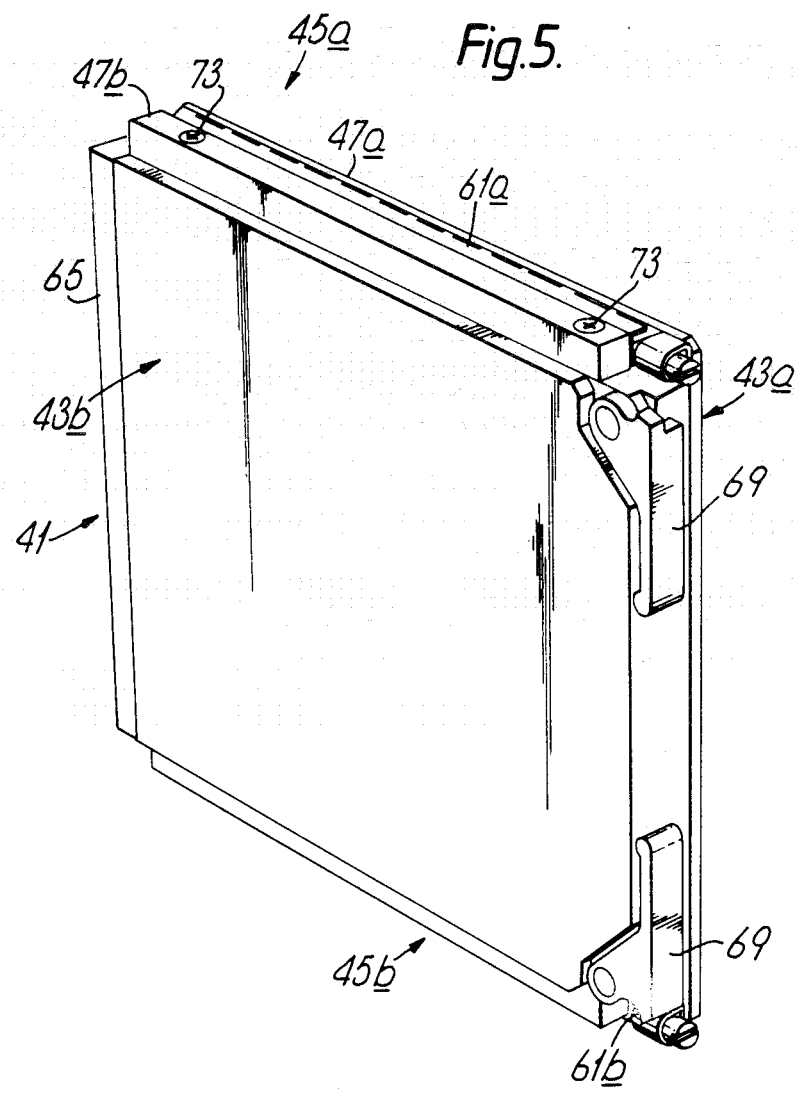
FIG. 5 is a perspective view corresponding to the perspective view of FIG. 1 depicting a first module according to the present invention.
Figure 6:
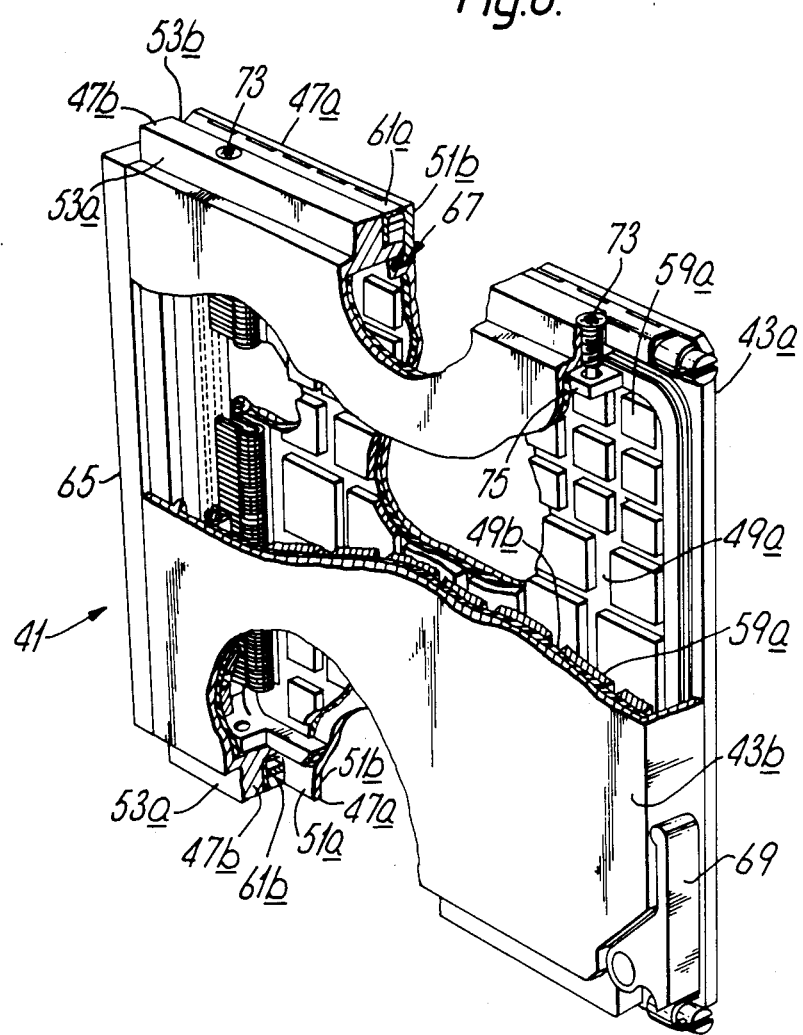
FIG. 6 is a cut-away perspective view of the module of FIG. 5.
Figure 7:
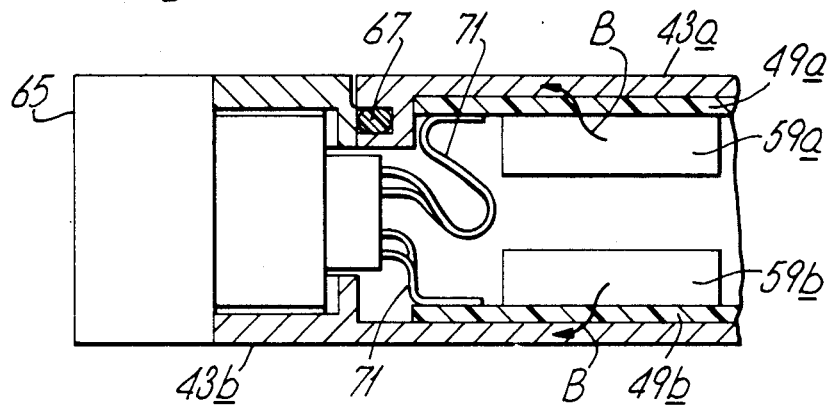
FIG. 7 is a detail of the module of FIGS. 5 and 6.

As will become apparent, the modules to be described are all of shallow box form and are adapted to be inserted into and withdrawn from a rack by a sliding action in a direction parallel to the major walls of the box.

Referring to FIGS. 1 to 4, the previously proposed module includes a central flat heat conductive plate 11, and two laminar substrates 13a, 13b secured to the central plate 11 one on each major surface 15a, 15b thereof. At each of one pair of opposite ends 19a, 19b the plate 11 has two lateral marginal surface portions 17a, 17b not covered by the substrates 13a, 13b. Two cover plates 21a, 21b secured to the central plate 11 and sealed thereto by gaskets 33 respectively serve as covers for the two substrates 13a, 13b and electrical components 23a, 23b carried thereby. Heat generated in the electrical components 23a, 23b is conducted along paths indicated by arrows A to the central plate 11. Adjacent to each of the marginal surface portions 17a, 17b there is a respective expansion device 25a or 25b.

With the marginal surface portions 17a, 17b received in opposed channels, as 27, formed in opposite walls 28 of a rack (see FIG. 4), operation of each expansion device 25a, 25b causes longitudinally extending surfaces thereof to contact the marginal surfaces, as 17b, and one 29b of the two side walls 29a, 29b of the channel 27, thereby urging the marginal surface 17a on the other side of the central plate 11 into intimate contact with the other 29a of the said two side walls of the channel 27. The expansion devices 27 may be of any form but are suitably of the type described in UK patent application No. 2103883A and U.S. Pat. No. 4,484,381, or of the type described in UK patent application No. 2137818A and U.S. Pat. No. 4,550,836, to which reference may be made for a detailed understanding of the construction of the expansion devices.

Attached to the module at a side of the module which extends between the rack engaging marginal surfaces 17a, 17b there is one part 31 of a two-part electrical connector the other part (not shown) of which is secured to a mother board (not shown) secured to the rack. The connection, when made, serves in the transmission of power and data signals to and from the electrical components 23a, 23b. The connector part 31 is sealed to the module by gaskets 33. Connection between the electrical components 23a, 23b on the substrates 13a, 13b and the connector part 31 is by way of flying leads 35 (see FIG. 3).

Two pivoted levers 37 are provided, one at each side of the module, which when rotated engage the side walls of the rack to assist by levering action in disconnection of the two connector parts when extracting the module from the rack.

The electrical components 23a, 23b are typically large scale integrated circuit devices, but may be any other electric circuit devices including discrete electric circuit elements.

Referring next to FIGS. 5 to 8, the first module in accordance with the invention to be described by way of example comprises a shallow box 41 which is formed in two heat conductive parts 43a, 43b, one 43a of which constitutes a lid part of the box 41. The two box parts 43a, 43b are loosely held in place with respect to one another by bolts 73 which are screwed into holes in the box part 43b and whose inner, unthreaded ends locate in oversize holes in lugs 75 projecting from the lid part 43a of the box. The two box parts 43a, 43b are sealed to one another by a gasket 67. The box has at each of two opposite ends 45a, 45b a pair of opposed projecting abutment portions 47a, 47b. One abutment portion 47a in each pair is integral with the lid part 43a and provides lateral surface portions 51a and 51b of the box. The other abutment portion 47b in each pair is integral with the other box part 43b and provides lateral surface portions 53a and 53b of the box. Two laminar substrates 49a, 49b are secured one, 49a with one of its major surfaces to the interior major surface of the lid part 43a and the other, 49b, with one of its major surfaces to the interior major surface of the other box part 43b. Heat generated in electrical components 59a, 59b carried by the two substrates 49a, 49b is conducted to box parts 43a, 43b along paths indicated by arrows B.

Between each of the two pairs of abutment portions 47a, 47b there is a respective expansion device 61a or 61b.

Figure 8:
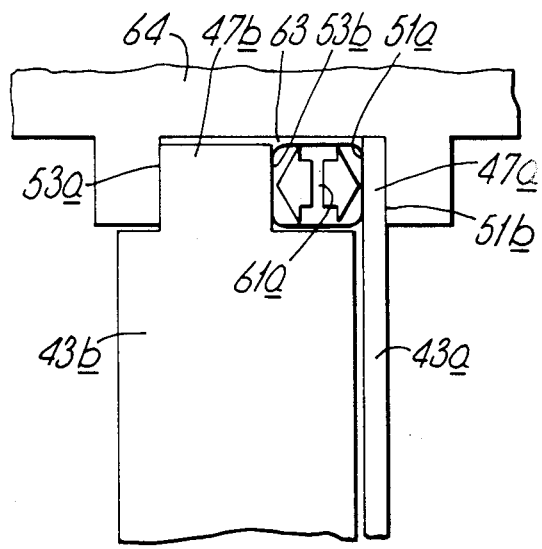
FIG. 8 is an outline diagram depicting the disposition of the module of FIGS. 5 and 6 in a rack channel.

As shown in FIG. 8 with each pair of abutment portions 47a, 47b of the module received in a respective one of opposed channels, as 63, in opposite side walls 64 of a rack, operation of the expansion device 61a, 61b causes longitudinal surfaces of each expansion device 61a or 61b to contact opposed lateral surface portions 51a and 53b on abutment portions 47a and 47b, and thereby produce relative movement between the lid part 43a and the other part 43b of the box 41. The lid part 43a is consequently driven into engagement at the surface 51b of each of its abutment portions with one side wall of the associated rack channel 63 and the surface 53a of each of the abutment portions 47b on the other box part 43b is driven into intimate contact with the other side wall of the associated rack channel 63. Heat is thus able to flow from the box parts 43a, 43b to the rack which acts as a heat sink or cold wall.

Attached to the module at a side of the module which extends between the rack engaging abutment portions 47a, 47b there is one part 65 of a two-part electrical connector the other part (not shown) of which is secured to a mother board (not shown) secured to the rack. The connection, when made, serves in the transmission of power and data signals to and from the electrical components 59a, 59b. The connector part 65 is sealed to the module by gasket 67. Two pivoted levers 69 are provided to assist in extraction of the module from the rack, as described above with reference to FIGS. 1 to 4. Connection between the electrical components 59a, 59b on the substrates 49a, 49b and the connector part 65 is by means of flying leads 71 (see FIG. 7).

Since in the module of FIGS. 5 to 8 the area of contact between the module and the side walls of the channel is effectively twice as large as that of a comparable module of the form illustrated in FIGS. 1 to 4, the module of FIGS. 5 to 8 has a higher thermal transfer efficiency than the module of FIGS. 1 to 4. Furthermore, due to the absence of a member corresponding to the central plate 11 of the module of FIGS. 1 to 4, the module of FIGS. 5 to 8 is lighter, and could, if desired, be made of more compact form.

Referring now to FIGS. 9 to 13, the second module in accordance with the invention to be described is in the form of a shallow box 111 having two separable heat conductive metal parts, a lid part 113 and a tray part 115. Complementary surfaces 117 at the edges of the lid and tray parts 113 and 115 serve to define the position of the lid part 113 with respect to the tray part 115, and an environmental seal 119 located in a groove around the edge of the lid part 113 contacts the edge of the tray part 115.

Rear and front walls 121a, 121b of the tray part 115 have elongate apertures 123a and 123b respectively. One part 125a of a first elongate multi-pin connector 127a is secured by screws 129 (FIGS. 10 and 11), to the tray part 115 with its pins 131a projecting through the elongate aperture 123a into the tray part 115. Similarly, one part 125b of a second elongate multi-pin connector 127b is secured by screws 129 (FIGS. 10 and 11) to the opposite end wall 121b of the tray part 115 with connector pins 131b projecting through the other elongate aperture 123b into the tray part 115. The connectors 127a, 127b are provided with environmental seals 132a, 132b.

The external major surfaces of the lid and tray parts 113 and 115 have a large number of parallel spaced ribs 133.

The major interior surfaces of the lid part and the tray part 113 and 115 have integral pad portions 135a, 135b distributed in rows and columns over the surface area.

Flexible printed circuit boards 137a, 137b having apertures corresponding in position to the pad portions 135a, 135b are located in the lid and tray parts 113 and 115 respectively with the pad portions received by the apertures.

Electrical components 139, for example, chip carriers, are positioned each in intimate contact with the inwards facing surface of an individual pad portion 135a or 135b, each being pressed into good thermal contact with the associated pad portion by means of a U-shaped spring clip 141 suitably made of wire.

The bridge portion 143 of each clip 141 is in pressure contact with the component 139, and the limb portions 145 of each clip 141 extend through holes in the printed circuit board 137a or 137b, to each side of the pad portion 135a or 135b, and through holes through the lid part 113 or the tray part 115 at positions between the external ribs 133. The ends of the limbs 143 are secured, as by solder, to the lid 113 or tray 115.

The flexible printed circuit boards 137a, 137b have a complex pattern of conductive track and these are selectively connected to the pins 131a, 131b of the connector parts 125a, 124b respectively, by conductive tracks incorporated in flexitapes 147a, 147b.

Figure 10:
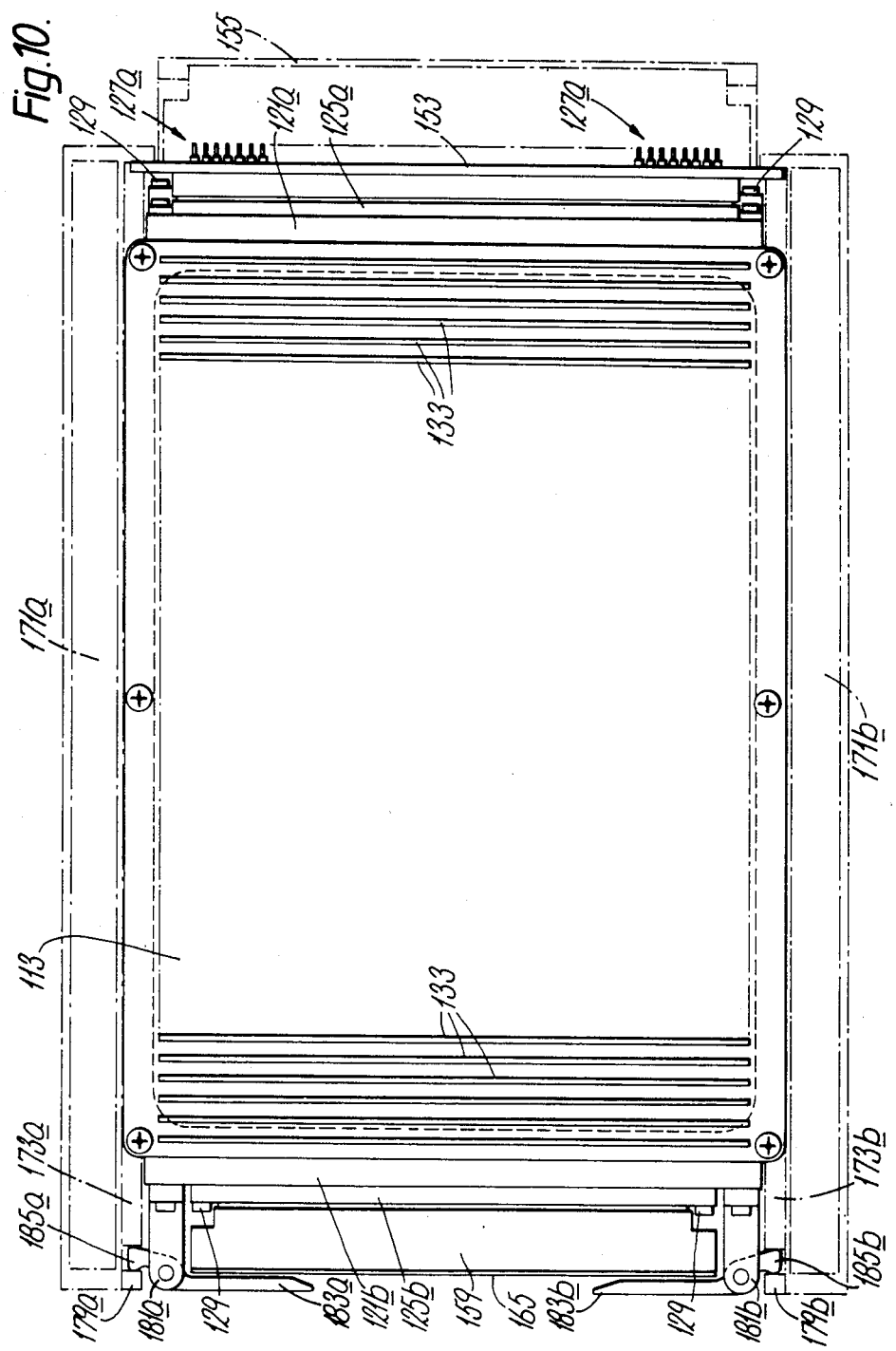
FIG. 10 shows in side elevation an external view of a module of FIG. 9 received by and retained in racking.
Figure 11:
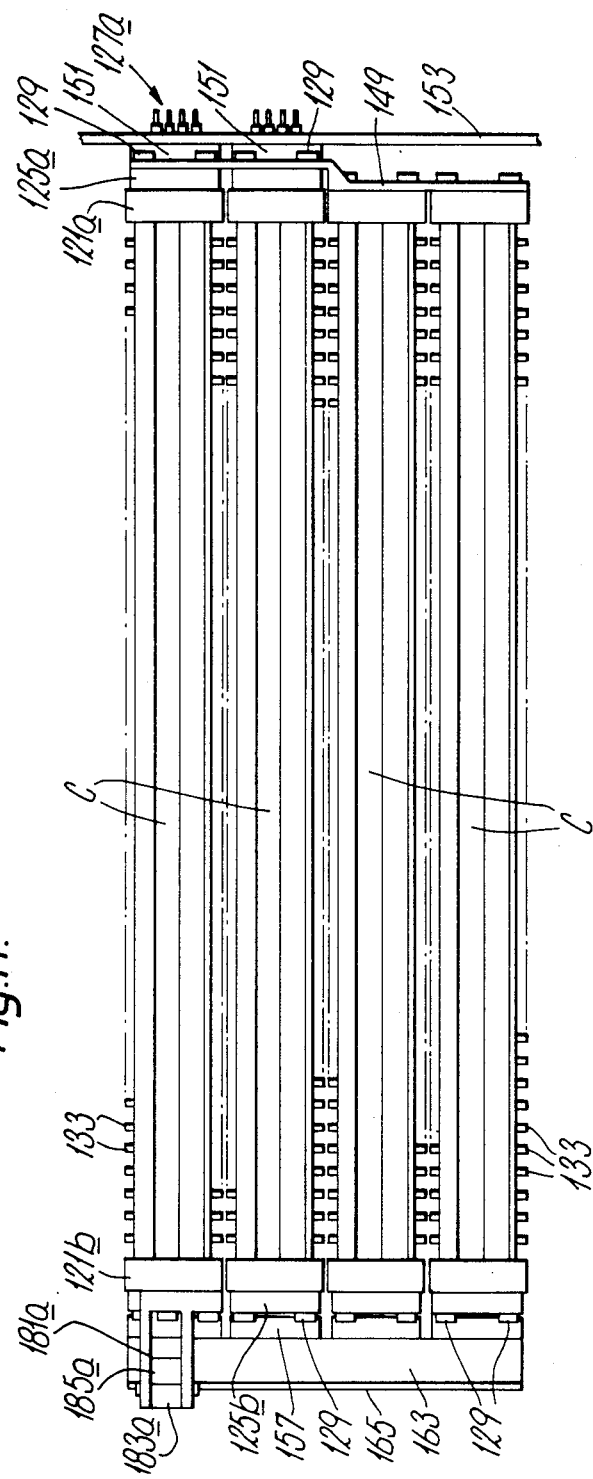
FIG. 11 shows in plan the arrangement of FIG. 10, but with the racking removed so as to reveal four modules ganged together.

As illustrated in FIGS. 10, 11 and 12 the module is arranged to fit slidingly into racking in parallel spaced relationship with other similar modules. As further explained below, some of the other modules may have one only of connector parts 125a and 125b.

As shown in FIG. 11, some adjacent modules in the rack may be ganged together at one end by means of a cross-strap 149 a group of four such ganged modules C being shown in FIG. 11. Other modules may be unganged, one such single unganged module D being shown in FIGS. 12 and 13. A limited number only, typically one or two only, of the modules in each ganged group of modules, is provided with a connector part 125a. Each such connector part 125a is in mating engagement with a respective complementary connector part 151 mounted on a back plate 153 forming part of the racking. The outlet pins from the connector parts 151 project through the back plate 153 and are connected to tracks of a printed circuit board (not shown) within a housing 155 which effect data traffic flow between electrical components of that group of ganged modules and the electrical components of other modules or groups of ganged modules.

Every module in each group of ganged modules has a connector part 125b which mates with a respective complementary connector part 157 mounted on the inner wall of a housing 159 with its several electrical terminals 161 projecting through holes into the interior of the housing 159. The housing 159 has, also, a shallow tray part 163, a lid part 165 and, between the two parts, an environmental seal 167.

Within the housing 159 there is a flexible printed circuit 169 provided with a pattern of conductive tracks which interconnect in any desired manner the terminals 161 thereby to determine the traffic in data between the modules of a group of ganged modules.

It will be appreciated that each single, unganged module is provided with a rear connector part 125a only which mates with a complementary connector part 151 mounted on back plate 153, data signal traffic to and from each unganged module being by way of the printed circuit board within housing 155. Thus the single modules have no connector part 125b.

It will be gathered from the foregoing description relating to the connector arrangement at the front and rear of the ganged modules that whereas the rear connector 127a is concerned with data traffic, in particular, between different groups of ganged modules or between such ganged modules and single modules, the front connector 127b is concerned with data traffic only between modules within a ganged group.

The racking has an upper plenum chamber 171a and a lower plenum chamber 171b.

The inwards facing walls of the two plenum chambers 171a, 171b, have opposed ribs 173a, 173b (FIG. 12); and the top and bottom walls 175a, 175b of the modules have fore and aft extending grooves 177a, 177b, respectively, which receive the opposed ribs 173a, 173b.

One of each set of ganged modules and each single, unganged module has projecting from its front wall 121b, upper and lower posts 181a, 181b. Manually operable levers 183a, 183b, pivotally connected to the ends of the posts 181a, 181b have tail portions 185a, 185b which lie in the spaces between the end projections 179a, 179b and the forward ends of the ribs 173a, 173b. The levers 183a, 183b facilitate insertion and removal of the modules into and from the racking between the plenum chambers 171a, 171b against the considerable force required to make or break the multi-pin connector between a module, or set of ganged modules, and the back plate 153.

It will be understood that the modules are a low friction sliding fit with the inwards facing walls of the plenum chambers 171a, 171b and there is no provision for clamping the modules to the plenum chambers or, indeed, any other part of the racking.

The upper plenum 171a has between adjacent module guide ribs 173a a multiplicity of openings 187a, spaced apart at intervals, between ribs 173a. The lower plenum 171b has between adjacent module guide ribs 173b, a multiplicity of openings 187b, spaced apart at intervals, between ribs 173b. The latter openings may, as illustrated, each have a metering orifice 189.

By virtue of external ribs 133 on the external major surfaces of the lid and tray portions 113 and 115 of the modules the external total surface area of these surfaces is relatively large. The ribs 133 serve as baffles directing cooling air through the openings 187b from the lower plenum chamber 171b vertically upwards to the openings 187a of the upper plenum chamber 171a.

The distribution of the ribs 133 is such that, as shown, ribs 133 of external surfaces of adjacent modules cooperate, when the levers 183a, 183b are in the position shown, and when the connectors between the modules and the printed circuit board within the housing 155 is fully made, form substantially closed conduits through which the cooling air flows between the lower and upper plenum chambers 171a, 171b.

The embodiment of FIGS. 9 to 13 has certain advantageous features and characteristics arising from the module construction in accordance with the invention.

The use of the lid and tray parts 113 and 115 of the box 111 to serve as ribbed cold walls for the components kept cool by flow by cooling and the avoidance, in consequence, of the need for a separate core to serve as a cold wall for the components results in a significant weight advantage with good thermal performance.

By spring loading electrical components 139 directly to the ribbed walls, thermal performance is further improved.

Figure 9:
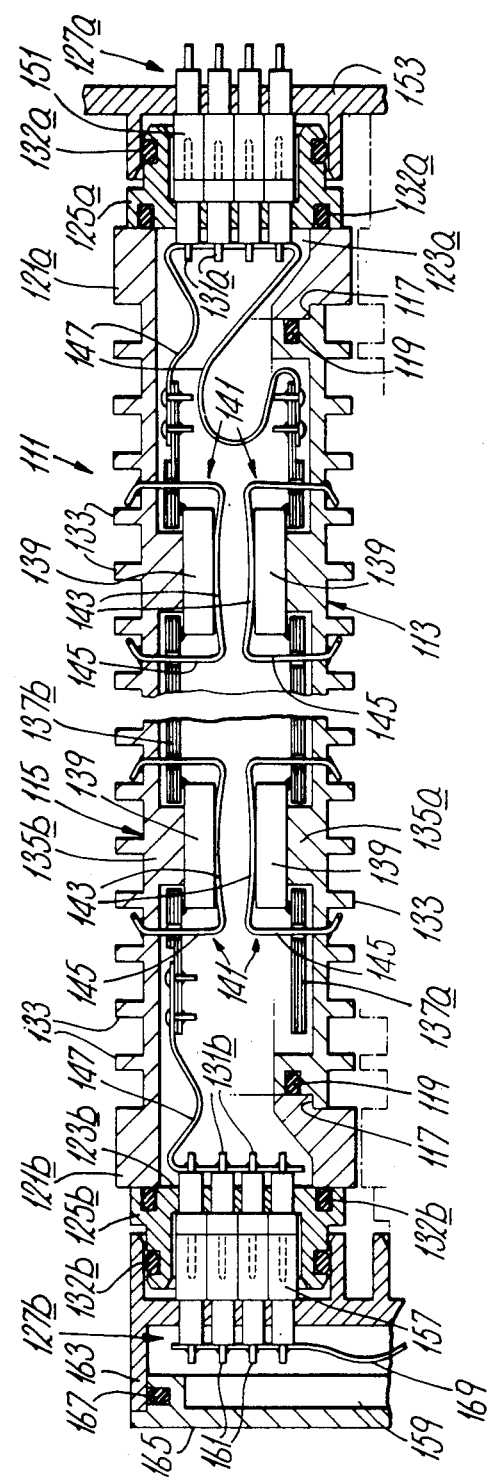
FIG. 9 is a sectional view of a second module in accordance with the present invention.

It will be appreciated that in other embodiments of the invention the component mounting arrangement of the module of FIGS. 5 to 8 may be used in the module of FIG. 9 and vice versa.

I claim:

1. A heat-dissipating electric circuit module, comprising:

(a) rectangular box including two parts of a material of a high thermal conductivity, each of said two box parts including a respective one of opposite external major walls of the box and having an interior major surface and external surface portions;
    (b) a first plurality of electrical components secured to, and mounted in good thermal contact with the interior major surface of, one of the box parts;
    (c) a second plurality of electrical components secured to, and mounted in good thermal contact with the interior major surface of, the other of the box parts;
    (d) each of said two box parts providing for the electrical components secured to its interior major surface a high thermal conductivity heat path extending to its external surface portions, whereby a major portion of heat generated in the electrical components during operation is conducted away from said components;
    (e) each of at least some of said electrical components being mounted in surface contact with an inward facing surface of a respective pad portion of the said interior major surface of the said box part to which that component is secured; and
    (f) a printed circuit board having a distribution of apertures corresponding to the distribution of pad portions located with a said box part with the pad portions received by said apertures of the board and the electrical components in contact with the pad portions electrically connected to tracks of the board.

2. A module according to claim 1 wherein said external surface portions comprise surface portions at opposite ends of the box, which surface portions with the module mounted in a rack, are adapted to make good thermal contact with the rack.

3. A module according to claim 2 wherein said box has at each of said two opposite ends thereof a pair of opposed lateral surface portions, one lateral surface portion in each pair being integral with one box part, and the other lateral surface portion in each pair being integral with the other box part; and between each said pair of opposed lateral surface portions there is a respective elongate expansion device which is operable to produce relative movement between the two box parts in the direction normal to the lateral surface portions, thereby to bring said external surface portions into contact with said rack.

4. A module according to claim 3 wherein each said lateral surface portion is constituted by a first surface of a respective abutment projecting from a said box part, and each said external surface portion is constituted by a second surface of a respective said abutment, each expansion device and its two associated abutments being adapted to be received in a respective channel in the rack so that on operation of said expansion devices said second surface on each abutment contacts a respective side wall of the associated channel.

5. A module according to claim 3 including means for holding said box parts in place with respect to one another, while allowing said relative movement between the box parts on operation of the expansion devices.

6. A module according to claim 5 wherein said means for holding said box parts comprises at least one bolt which screws into a hole in one part whose inner end fits loosely in a hole in a member projecting from the other box part.

7. A module according to claim 1 wherein said external surface portions comprise external major surfaces of said box parts.

8. A module according to claim 7 wherein said external major surfaces of said box parts have a configuration of parallel rib portions.

9. A module according to claim 8 wherein said rib portions are adapted to co-operate with rib portions of adjacent modules mounted in parallel spaced relationship in a rack to form baffles for directing a flow of cooling fluid over said external major surfaces of said box parts, between chambers on opposite sides of the module.

10. A module according to claim 1 wherein each of said at least some electrical components is pressed into surface contact with its pad portion by means of an individual U-shaped spring clip the two limb portions of which are fixed at their ends to the associated box part, and the bridge portion of which bears against the electrical component so as to hold the electrical component in contact with the said inward facing surface under spring pressure.

11. A module according to claim 10 wherein said two limb portions extend through spaced apart apertures in the associated box part, and are fixed thereto.

12. A module according to claim 11 wherein said limb portions are fixed to said box parts by soldering.

* * * * *